(12) United States Patent
Choi et al.

(10) Patent No.: US 10,318,051 B2
(45) Date of Patent: Jun. 11, 2019

(54) CONTACT SENSITIVE DEVICE, DISPLAY APPARATUS INCLUDING THE SAME AND METHOD OF MANUFACTURING THE SAME

(71) Applicant: LG DISPLAY CO., LTD., Seoul (KR)

(72) Inventors: Seulgi Choi, Incheon (KR); Yong-Su Ham, Seoul (KR); Taeheon Kim, Seoul (KR); YongWoo Lee, Goyang-si (KR); YuSeon Kho, Seoul (KR); MyungJin Lim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 38 days.

(21) Appl. No.: 15/394,395

(22) Filed: Dec. 29, 2016

(65) Prior Publication Data
US 2017/0192595 A1    Jul. 6, 2017

(30) Foreign Application Priority Data

Dec. 31, 2015  (KR) .................. 10-2015-0191610

(51) Int. Cl.
*G06F 3/044*  (2006.01)
*G06F 3/041*  (2006.01)
(Continued)

(52) U.S. Cl.
CPC ............ *G06F 3/0416* (2013.01); *G06F 3/016* (2013.01); *G06F 3/041* (2013.01); *H01L 41/0477* (2013.01); *H01L 41/09* (2013.01); *H01L 41/1132* (2013.01); *H01L 41/193* (2013.01); *H01L 41/253* (2013.01); *H01L 41/45* (2013.01); *C08J 9/26* (2013.01); *C08J 2201/0464* (2013.01); *C08J 2353/00* (2013.01); *G06F 2203/04103* (2013.01)

(58) Field of Classification Search
CPC combination set(s) only.
See application file for complete search history.

(56) References Cited

U.S. PATENT DOCUMENTS

2009/0305141 A1    12/2009  Lee et al.
2010/0328053 A1    12/2010  Yeh et al.
(Continued)

FOREIGN PATENT DOCUMENTS

KR       10-0791791 B1      12/2007
KR    10-2015-0070979 A      6/2015

OTHER PUBLICATIONS

Lang, S.B., et al.: "Review of some lesser-known applications of piezoelectric and pyroelectric polymers", Applied Physics A; Materials Science & Processing, vol. 85, No. 2, Sep. 1, 2006, pp. 125-134, XP019424468.
(Continued)

*Primary Examiner* — Van N Chow
(74) *Attorney, Agent, or Firm* — Dentons US LLP

(57) ABSTRACT

Provided are a contact sensitive device, a display apparatus including the same, and a method of manufacturing the same. The contact sensitive device includes an electroactive layer formed of an electroactive polymer having a plurality of nano pores and an electrode disposed on at least one surface of the electroactive layer. The electroactive layer has a β-phase structure and improved piezoelectricity without performing a stretching process or a polling process.

16 Claims, 10 Drawing Sheets

(51) Int. Cl.
*G06F 3/01* (2006.01)
*H01L 41/09* (2006.01)
*H01L 41/45* (2013.01)
*H01L 41/047* (2006.01)
*H01L 41/113* (2006.01)
*H01L 41/193* (2006.01)
*H01L 41/253* (2013.01)
*C08J 9/26* (2006.01)

(56) References Cited

U.S. PATENT DOCUMENTS

| | | | |
|---|---|---|---|
| 2015/0153886 A1* | 6/2015 | Hunt | G06F 3/017 345/174 |
| 2016/0179260 A1* | 6/2016 | Ham | G06F 3/0412 345/173 |
| 2016/0218340 A1 | 7/2016 | Ryu et al. | |

OTHER PUBLICATIONS

Chen, D. et al.: "Microporous polyvinylidene fluoride film with dense surface enables efficient piezoelectric conversion", Applied Physics Letters, vol. 106, No. 19, May 11, 2015, XP012197380.
Ramandan, K. et al.: "A review of piezoelectric polymers as functional materials for electromechanical transducers", Smart Materials and Structures, vol. 23, No. 3, Jan. 20, 2014, XP020258249.
Jia, C.H. et al.: "Photoluminescence properties of porous InP filled with ferroelectric polymers", Applied Physics A Materials Science & Processing, vol. 111, No. 3, Apr. 30, 2013, XP035330612.

* cited by examiner

US 10,318,051 B2

CONTACT SENSITIVE DEVICE, DISPLAY APPARATUS INCLUDING THE SAME AND METHOD OF MANUFACTURING THE SAME

CROSS-REFERENCE TO RELATED APPLICATIONS

This application claims priority from Korean Patent Application No. 10-2015-0191610 filed on Dec. 31, 2015, the disclosure of which is incorporated by reference in its entirety as if fully set forth herein.

BACKGROUND

Technical Field

The present disclosure relates to a contact sensitive device, a display apparatus including the same, and a method of manufacturing the same, including a contact sensitive device which includes an electroactive layer formed of an electroactive polymer, a display apparatus including the same, and a method of manufacturing the same.

Description of the Related Art

Recently, a touch type display apparatus which inputs information by touching a display apparatus is in common use because of an increase in demand for such devices from users using various display apparatus, including liquid crystal display devices and organic light emitting display devices. In response to this, there is ongoing study related to the use of haptic devices, which provide direct and various touch feedbacks to the user. In related art, a haptic device is generally attached to a rear surface of a display panel. Thus, it is difficult to provide immediate and minute feedback in response to the touch of the user. As a result, there is interest in providing a variety of direct feedbacks which are sensitive to the touch of the user by disposing the haptic device above the display panel.

In related art, a vibration motor such as an eccentric rotating mass (ERM) or a linear resonant actuator (LRA) is used as a haptic device in a display apparatus. However, the size of such devices needs to be increased to increase the intensity of the vibrations, because the vibration motor is configured to vibrate the entire display apparatus. Further, is difficult to modulate a frequency of the vibration motor to adjust the level of the vibrations, and a response speed is very low, which are problematic. Furthermore, the eccentric rotating mass and the linear resonant actuator are formed of opaque materials, and thus, it is difficult to dispose the eccentric rotating mass and the linear resonant actuator above the display panel.

In order to solve the above-described problems, a shape memory alloy (SMA) and electro-active ceramics (EAC) are being considered as potential materials for the haptic device. However, the shape memory alloy (SMA) has a low response speed, a short life-span, and is formed of an opaque material. On the other hand, electro-active ceramics (EAC) have low durability against the external impact, and are easily broken due to external impact. The electro-active ceramics are also opaque. Further, it is difficult to manufacture a thin electro-active ceramic.

SUMMARY

An exemplary objective of the present disclosure is to provide a contact sensitive device which includes an electroactive layer formed of an electroactive polymer having a (β-phase structure without performing a stretching process or a polling process, a display apparatus including the same, and a method of manufacturing the same.

Another exemplary objective of the present disclosure is to provide a contact sensitive device having improved driving displacement and vibration intensity, a display apparatus including the same, and a method of manufacturing the same.

An exemplary embodiment of the present disclosure is a contact sensitive device, comprising: an electroactive layer comprising an electroactive polymer having a plurality of nano pores; and an electrode disposed on at least one surface of the electroactive layer.

In another exemplary embodiment, the electroactive polymer is a ferroelectric polymer.

In another exemplary embodiment, the electroactive polymer is a polyvinylidenefluoride (PVDF)-based polymer.

In another exemplary embodiment, the plurality of nano pores are arranged in a planar direction with respect to the electroactive layer.

In another exemplary embodiment, a pore diameter in the planar direction is larger than a pore diameter in a thickness direction of each of the plurality of nano pores.

In another exemplary embodiment, a porosity of the electroactive layer is 30% to 60%.

In another exemplary embodiment, a density of the electroactive layer is 800 kg/cm$^3$ to 1400 kg/m$^3$.

In another exemplary embodiment, the electroactive polymer is nanocrystalline and has a β-phase structure.

In another exemplary embodiment, the contact sensitive device further comprises: a refractive index matching material, wherein the refractive index matching material is present in the plurality of nano pores.

In another exemplary embodiment, a refractive index of the refractive index matching material is 1.2 to 1.6.

In another exemplary embodiment, the refractive index matching material is one or more selected from the group consisting of polyvinylidenefluoride-trifluoroethylene-chlorotrifluoroethylene (P(VDF-TrFE-CTFE)), polyvinylidenefluoride-trifluoroethylene-chlorofluoroethylene (P(VDF-TrFE-CFE)), polyvinylidenefluoride-trifluoroethylene-hexafluoropropene (P(VDF-TrFE-HFP)), polyvinylidenefluoride-trifluoroethylene-chlorodifluoroethylene (P(VDF-TrFE-CDFE)), polyvinylidenefluoride-tetrafluoroethylene-chlorotrifluoroethylene (P(VDF-TFE-CTFE)), polyvinylidenefluoride-tetrafluoroethylene-chlorofluoroethylene (P(VDF-TFE-CFE)), polyvinylidenefluoride-tetrafluoroethylene-hexafluoropropene (P(VDF-TFE-HFP)), and polyvinylidenefluoride-trifluoroethylene-chlorodifluoroethylene (P(VDF-TFE-CDFE)).

Another exemplary embodiment of the present disclosure is a display apparatus, comprising: a display panel; and a contact sensitive device, wherein the contact sensitive device includes an electroactive layer comprising an electroactive polymer having a plurality of nano pores and an electrode disposed on at least one surface of the electroactive layer.

In another exemplary embodiment, the display apparatus further comprises: a touch panel on the display panel, wherein the contact sensitive device is disposed between the display panel and the touch panel.

Another exemplary embodiment of the present disclosure is a method of manufacturing a contact sensitive device, the method comprising: forming a block copolymer comprising an electroactive polymer and an amorphous polymer; forming a lamellar film from the block copolymer; and forming an electroactive layer including a plurality of nano pores by etching the lamellar film to remove the amorphous polymer.

In another exemplary embodiment, the amorphous polymer is polystyrene.

In another exemplary embodiment, the method of manufacturing a contact sensitive device further comprises: filling the plurality of nano pores with a refractive index matching material.

The present disclosure is not limited to the above-mentioned objectives, and other objectives, which are not mentioned above, but can be easily understood by those skilled in the art from the following descriptions are included therein.

According to the present disclosure, a contact sensitive device including an electroactive layer with improved piezoelectricity may be provided, because the electroactive layer may have a β-phase without performing a stretching process or a polling process. Further, piezoelectricity and light transmittance of the contact sensitive device may be improved.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Figure 1A:
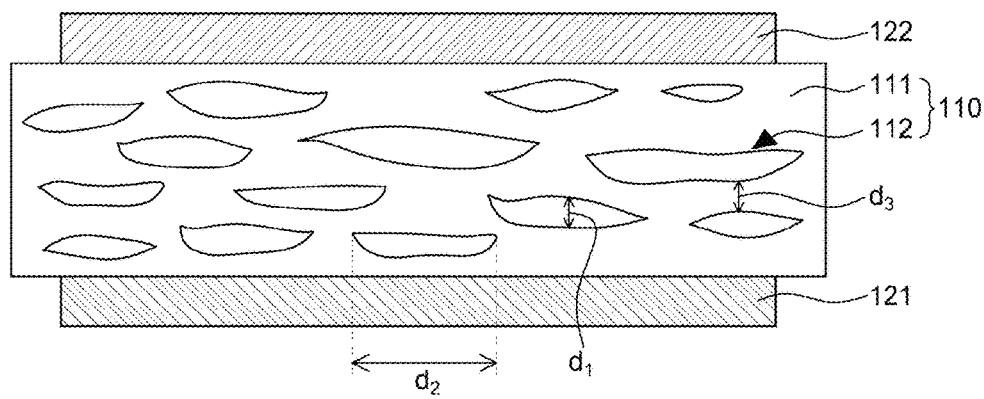
FIG. 1A is a schematic cross-sectional view illustrating a variable device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein and can be implemented in various forms. The exemplary embodiments are provided only so that a person of ordinary skilled in the art can fully understand the disclosures of the present disclosure and the scope of the present disclosure. The present disclosure will be defined only by the scope of the appended claims, and any combinations thereof.

The shapes, sizes, ratios, angles, numbers, and the like, illustrated in the accompanying drawings for describing the exemplary embodiments of the present disclosure are merely exemplary, and the present disclosure is not limited thereto. Like reference numerals generally denote like elements throughout the specification. Further, in the following description, a detailed explanation of known related technologies may be omitted for brevity of explanation and to avoid unnecessarily obscuring the subject matter of the present disclosure. Terms such as "including," "having," and "consisting of" used herein are generally intended to allow other components to be added unless the terms are used in conjunction with the term "only". Any references to the singular may include the plural unless expressly stated otherwise.

Components are interpreted to include an ordinary error range even if not expressly stated.

When the positional relation between two parts is described using terms such as "on", "above", "below", and "next", one or more parts may be positioned between the two parts unless the terms are used in conjunction with the term "immediately" or "directly".

When an element or layer is disposed "on" other element or layer, another layer or another element may be interposed therebetween.

Although the terms "first", "second", and the like are used for describing various components, the terms are merely used for distinguishing one component from the other components, and these components are not confined by these terms. Therefore, a first component may be a second component in a technical concept of the present disclosure.

A size and a thickness of each component illustrated in the drawing are illustrated for convenience of description, and is not necessarily to scale.

The features of various embodiments of the present disclosure can be partially or entirely bonded to or combined with each other and can be interlocked and operated in technically various ways, and the embodiments can be carried out independently of or in association with each other.

Hereinafter, various exemplary embodiments of the present disclosure will be described in detail with reference to accompanying drawings.

Figure 1B:
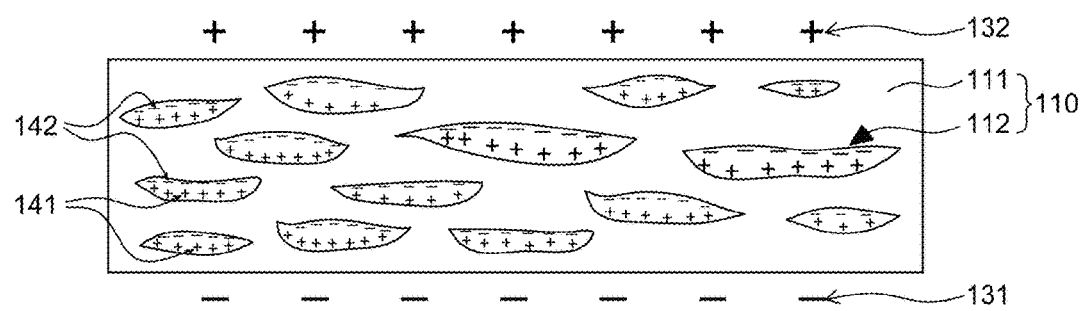
FIG. 1B is a schematic view illustrating the polarization of an electroactive layer when a voltage is applied to a variable device according to an exemplary embodiment of the present disclosure.

FIG. 1A is a schematic cross-sectional view illustrating a variable device according to an exemplary embodiment of the present disclosure, and FIG. 1B is a schematic view illustrating the polarization of an electroactive layer when a voltage is applied to the variable device according to this exemplary embodiment of the present disclosure. As illustrated in FIGS. 1A and 1B, a variable device 100 includes an electroactive layer 110, a first electrode 121, and a second electrode 122.

The shape of the electroactive layer 110 is changed according to an applied voltage and vibrations are generated therein. The electroactive layer 110 includes an electroactive polymer (EAP) and nano pores 112. The electroactive polymer is a polymer material which is modified by electrical stimulation. The electroactive polymer may be a dielectric elastomer, such as a silicon-based, urethane-based, and an acrylic-based elastomer, or a ferroelectric polymer, such as a polyvinylidene fluoride-based polymer.

The electroactive polymer of the electroactive layer 110 may be a ferroelectric polymer which has a natural polarity. For example, the ferroelectric polymer may be a PVDF-based polymer, which includes a PVDF repeating unit in a main chain of the polymer. The PVDF-based polymer is a crystalline polymer having excellent piezoelectricity and is thus, suitable for use as an electroactive polymer in the variable device according to an exemplary embodiment of the present disclosure. For example, the PVDF polymer may be a PVDF homo-polymer or a PVDF co-polymer.

As an exemplary embodiment, a variable device that uses a PVDF-based polymer 111 as an electroactive polymer will be described as follows, but the present disclosure is not limited thereto.

The nano pores 112 are present in the PVDF-based polymers 111 and are randomly formed in and on a surface of the electroactive layer 110. The nano pores 112 have an average diameter of several tens nanometers to several hundred nanometers.

For example, the PVDF-based polymer 111 and the nano pores 112 are arranged in a planar direction of the electroactive layer 110. As illustrated in FIG. 1A, the PVDF-based polymer 111 and the nano pores 112 are randomly assembled to have a partially layered structure. The electroactive layer 110, which includes the nano pores 112 and the PVDF-based polymer 111, may be formed from a block co-polymer including a PVDF-based polymer 111, which is a crystalline polymer, and an amorphous polymer. After forming a block copolymer film, which includes a PVDF-based polymer 111 and an amorphous polymer, and has a lamellar structure, the amorphous polymer is removed to form the nano pores 112. An exemplary process of forming the electroactive layer 110 having nano pores will be described below with reference to FIG. 3.

The lamellar structure of the present disclosure is a layered structure formed by two or more materials having different properties which are in contact with each other. layered structure is formed by partially laminating two materials lengthwise in a direction perpendicular to a thickness direction thereof. The thickness direction with respect to the electroactive layer 110 is a direction perpendicular to a surface of the electroactive layer 110 and a planar direction with respect to the electroactive layer 110 is a direction parallel to the surface of the electroactive layer 110.

A pore diameter of the nano pores 112 in a planar direction is larger than a pore diameter of the nano pores 112 in a thickness direction. A pore diameter d1 of the nano pores 112 in the thickness direction with respect to the electroactive layer 110 is 10 nm to 150 nm and a pore diameter d2 of the nano pores 112 in the planar direction with respect to the electroactive layer 110 is several tens of nanometers to several thousands of nanometers. That is, the nano pores 112 have a shape extended in a planar direction rather than a typical spherical shape. The piezoelectricity of the electroactive layer 110 may be significantly improved because of the extended shape of the nano pores 112 in the planar direction. Additionally, a distance d3 in the thickness direction between nano pores 112 may be 20 nm to 150 nm.

When a PVDF homo polymer is used, a stretching process and a polling process need to be performed to impart permittivity and piezoelectricity to the polymer. When the stretching process is performed, a main chain of the PVDF homopolymer extends to remove steric hindrance between fluoro groups connected to a carbon atom and a space where the β-phase in which all fluoro groups are trans type is formed is secured. However, when the PVDF homopolymer is stretched, the roughness increases, thereby lowering light transmittance and significantly increasing a haze. Further, a PVDF-based homopolymer having a β-phase includes a mixture of trans- and gauche-type fluoro groups (–F) with numerous electrons along a main chain. In such a β-phase structure, dipole moments are cancelled by each other and the intensity of polarization is low.

In the case of a PVDF copolymer such as P(VDF-TREE) or P(VDF-CFE), a stretching process is not required, but a polling process is required to impart piezoelectricity to the copolymer, which is different from the PVDF homopolymer. In order to perform the polling process on the PVDF copolymer, an electric field which is higher than a coercive field needs to be applied, and thus, the initial driving voltage is undesirably high.

In the case of other PVDF copolymers such as P(VDF-TrFE-CTFE) or P(VDF-TrFE-CFE), even if a polling process is not necessary due to the low initial driving voltage, the intensity of polarization is very low.

However, as described above, a block co-polymer of the crystalline PVDF-based polymer 111 and an amorphous polymer is used in the preparation of the electroactive layer 110. Crystal growth of the PVDF-based polymer 111 is spatially restricted by the amorphous polymer, which is removed to create the nano pores 112. As a result, the PVDF-based polymer 111 of the electroactive layer 110 has a β-phase structure having a short unit-interatomic distance rather than a β-phase structure having a long unit-interatomic distance because of the small size of the crystalline PVDF units. In other words, in the case of the PVDF-based polymer 111 of the variable device 100, a nano-scale crystalline structure is formed during the process of forming the electroactive 110 using the co-polymer of a crystalline PVDF-based polymer 111 and an amorphous polymer. Therefore, the β-phase structure is formed only at a nanoscale. Accordingly, in the PVDF-based polymer 111 of the electroactive layer 110, the fluoro groups are oriented in one direction without having to perform a separate stretching process or polling process, and the resulting polarization intensity is higher than a general PVDF-based polymer.

The electroactive layer 110 of the variable device 100 has a high polarization intensity and excellent piezoelectricity even in a natural state in which a stretching process or a polling process is not performed. Further, the piezoelectric performance of the electroactive layer 110 may be improved by applying a low driving voltage without separately performing a polling process, as compared with a case when a polling process is performed on a general PVDF-based polymer, because the PVDF-based polymer 111 has a nano crystalline structure.

A polling voltage, which is required to initiate the piezoelectric property of a general PVDF-based polymer, is proportional to the coercive field value. Thus, when a crystal size of the PVDF-based polymer is small, such as in the PVDF-based polymer 111, the coercive field value is low, and the polling process may be performed on the PVDF-based polymer 111 at a low voltage. In other words, due to the low coercive field of a nano size crystalline structure, the same effect obtained by performing the polling process may be achieved only by the application of an initial driving voltage which drives the variable device without separately performing a polling process. The polarization of the electroactive layer 110 after application of a voltage to the electroactive layer 110 will be described with reference to FIG. 1B.

As illustrated in FIG. 1B, when a voltage is applied to the electroactive layer 110 to drive the variable device, charges 132 and 131 are formed not only above and below the electroactive layer 110 but also on interfaces 141 and 142 between the PVDF-based polymer 111 and the nano pores 112. In this case, even though the variable device 100 has a single electroactive layer 110, as illustrated in FIG. 1B, a large amount of charge is formed in the electroactive layer 110 due to the nano pores 112, which is similar in magnitude to the charge distribution formed when a plurality of electroactive layers 110 are laminated, thereby significantly improving the polarization intensity.

The porosity of the electroactive layer 110 including the nano pores 112 is 30% to 60%. When the porosity of the electroactive layer 110 satisfies the above-mentioned range, nano pores 112 arranged in a planar direction are formed and the electroactive layer 110 has a nano-scale β-phase structure without separately performing a stretching process. Therefore, the piezoelectric performance of the electroactive layer 110 may be improved.

The density of the electroactive layer 110 may be 800 $kg/m^3$ to 1400 $kg/m^3$. Generally, a PVDF film manufactured by coextrusion of a PVDF-based polymer has an approximate density of 2000 $kg/m^3$. In contrast, the electroactive layer 110 of the variable device 100 has a porosity of 30% to 60%, which results in a significantly low density of 800 $kg/m^3$ to 1400 $kg/m^3$ as compared with a PVDF film in which the nano pores 112 are not formed.

A plurality of electrodes which apply an electric field to the electroactive layer 110 are disposed on at least one surface of the electroactive layer 110 to induce vibrations or bending by electric stimulation. In the variable device 100 illustrated in FIG. 1A, a first electrode 121 is disposed on a lower surface of the electroactive layer 110 and a second electrode 122 is deposited on an upper surface of the electroactive layer 110, but the present disclosure is not limited thereto.

The first electrode 121 and the second electrode 122 are formed of a conductive material. For example, the first electrode 121 and the second electrode 122 are formed of a metal material such as gold (Au), copper (Cu), titanium (Ti), chrome (Cr), molybdenum (Mo), aluminum (Al), or aluminum-copper alloy (Al—Cu alloy) or a conductive material such as poly(3,4-ethylenedioxythiophene (PEDOT), poly(4-styrenesulfonic acid (PSS), polypyrrole, or polyaniline. Further, the first electrode 121 and the second electrode 122 may be a soft electrode manufactured by mixing an elastic body and carbon conductive grease, carbon black or carbon nano tube (CNT) so as to be suitable for smooth and repeated driving of the variable device 100. The first electrode 121 and the second electrode 122 may be formed of the same material or different materials.

The first electrode 121 and the second electrode 122 are disposed on both surfaces of the electroactive layer 110 using various methods, including a sputtering method, a printing method, or a slit coating method. When the first electrode 121 and the second electrode 122 are formed of the same material, the first electrode 121 and the second electrode 122 may be simultaneously disposed on the surface of the electroactive layer 110.

An external voltage is applied to the first electrode 121 and the second electrode 122 to form an electric field. In order to form an electric field in the electroactive layer 110, different levels of voltages or voltages having opposite electrical properties may be applied to the first electrode 121 and the second electrode 122. For example, when a positive (+) voltage is applied to the first electrode 121, a negative (−) voltage or a ground voltage is applied to the second electrode 122. Alternatively, when a negative (−) voltage is applied to the first electrode 121, a positive (+) voltage or a ground voltage may be applied to the second electrode 122. The direction of the electric field generated is changed based on the electrical property of the voltage applied to the first electrode 121 and the electrical property of the voltage applied to the second electrode 122.

An AC voltage or a DC voltage may be applied to the first electrode 121 and the second electrode 122. When an AC voltage is applied to the first electrode 121 and the second electrode 122, the electroactive layer 110 may be periodically moved, to produce the vibrations. When a DC voltage is applied to the first electrode 121 and the second electrode 122, the electroactive layer 110 may be bent to produce the vibrations.

As described above, the variable device 100 according to an exemplary embodiment of the present disclosure includes an electroactive layer 110 formed of a PVDF-based polymer 111 having a plurality of nano pores 112, thereby significantly improving the piezoelectricity of the electroactive layer 110. As a result, a driving displacement of the variable device 100 is significantly improved and the driving voltage is lowered. In other words, the variable device 100 solves a problem associated with the use of standard PVDF-based polymers due to the inclusion of the nano pores 112.

Figure 2A:
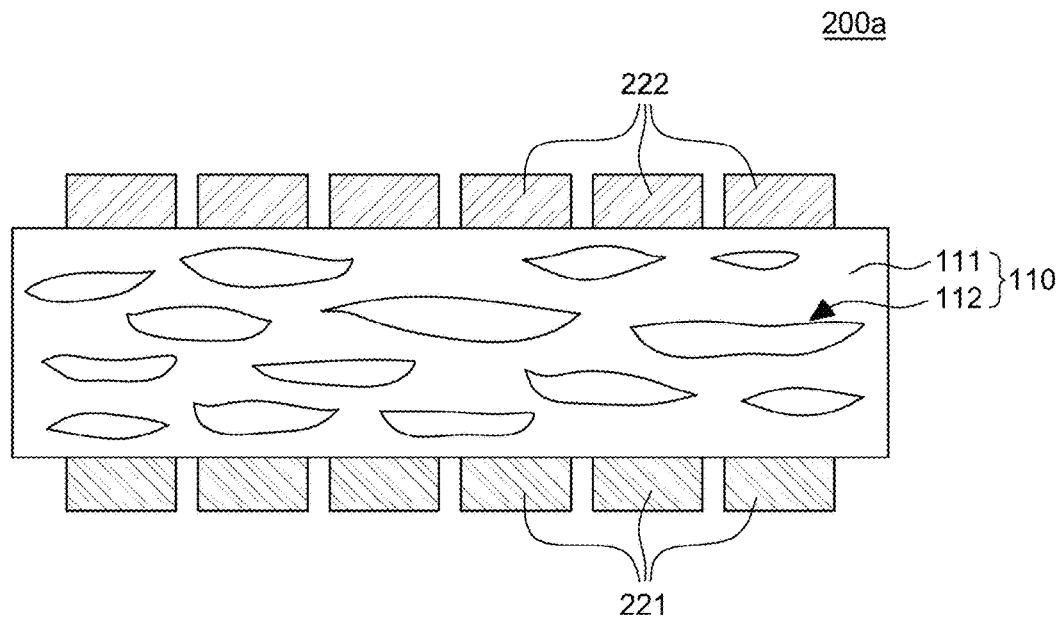
FIG. 2A is a schematic cross-sectional view illustrating a contact sensitive device according to an exemplary embodiment of the present disclosure.

FIG. 2A is a schematic cross-sectional view illustrating a contact sensitive device according to an exemplary embodiment of the present disclosure. A contact sensitive device is a device which transmits a tactile feedback to the user based on a user contact with a contact sensitive device.

As illustrated in FIG. 2, the contact sensitive device 200a includes an electroactive layer 110, a plurality of first electrodes 221, and a plurality of second electrodes 222. The contact sensitive device 200a illustrated in FIG. 2 is the same as the variable device 100 illustrated in FIG. 1, except for the different configurations of the electrodes 221 or 222. Therefore, redundant descriptions thereof will be omitted.

As illustrated in FIG. 2, a plurality of electrodes which apply an electric field to the electroactive layer 110 are disposed on both surfaces of the electroactive layer 110. The plurality of electrodes includes a plurality of first electrodes 221 and a plurality of second electrodes 222. The plurality of first electrodes 221 and the plurality of second electrodes 222 are formed of a conductive material. In order to secure light transmittance of the contact sensitive device 200a, the plurality of first electrodes 221 and the plurality of second electrodes 222 may be formed of a transparent conductive material. For example, the plurality of first electrodes 221 and the plurality of second electrodes 222 may be formed of a transparent conductive material such as ITO, IZO, graphene, a metal nanowire, and transparent conductive oxide (TCO). Further, the plurality of first electrodes 221 and the plurality of second electrodes 222 may be formed of a metal mesh in which a metal material is disposed in the form of a mesh, so as to be substantially transparent. However, the material which forms the plurality of first electrodes 221 and the plurality of second electrodes 222 is not limited to the above-described examples, and may include various transparent conductive materials.

The plurality of first electrodes 221 are disposed on one surface of the electroactive layer 110 and the plurality of second electrodes 222 are disposed on the opposite surface of the electroactive layer 110. For example, as illustrated in FIG. 2A, the plurality of first electrodes 221 may be disposed on a lower surface of the electroactive layer 110 and the plurality of second electrodes 222 may be disposed on an upper surface of the electroactive layer, but the present disclosure is not limited to this arrangement. The plurality of first electrodes 221 and the plurality of second electrodes 222 overlap each other. For example, as illustrated in FIG. 2, plurality of first electrodes 221 and the plurality of second electrodes 222 overlap on a one-to-one basis, but the present disclosure is not limited thereto. A specific area where the plurality of first electrodes 221 and the plurality of second electrodes 222 overlap may be defined as one tactile cell. Here, the tactile cell is a minimum unit which transmits a tactile feedback to the user and each tactile cell may independently transmit the tactile feedback.

In some exemplary embodiments, the plurality of first electrodes 221 extend in a first direction and the plurality of second electrodes 222 extend in a second direction intersecting the first direction. The intersecting area where the plurality of first electrodes 221 and the plurality of second electrodes 222 intersect may be defined as a tactile cell.

The contact sensitive device 200a includes a plurality of electrodes 221 and 222 on both surfaces of the electroactive layer 110, thereby forming a plurality of tactile cells. Therefore, the electroactive layer 110 may independently vibrate in each tactile cell. The contact sensitive device 200a may transmit various feedbacks to the user by independently applying various voltages to the plurality of electrodes 221 and 222.

As described above, the contact sensitive device 200a includes the electroactive layer formed of a PVDF-based polymer 111 having a plurality of nano pores 112, thereby significantly improving the piezoelectricity of the electroactive layer 110. As a result, the vibration intensity of the contact sensitive device 200a is improved so that a strong tactile feedback may be transmitted to the user.

Figure 2B:
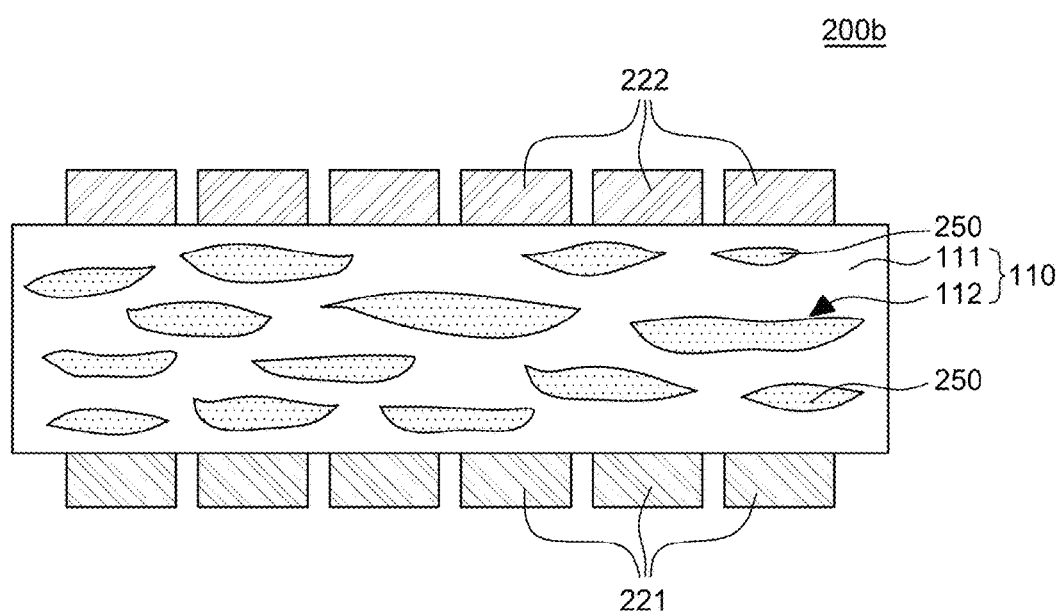
FIG. 2B is a schematic cross-sectional view illustrating a contact sensitive device according to another exemplary embodiment of the present disclosure.

FIG. 2B is a schematic cross-sectional view illustrating a contact sensitive device according to another exemplary embodiment of the present disclosure. The contact sensitive device 200b illustrated in FIG. 2B is the same as the contact sensitive device 200a illustrated in FIG. 2A, except that a refractive index matching material 250 fills the nano pores 112. Therefore, redundant descriptions thereof will be omitted.

The contact sensitive device 200b is advantageously disposed to be close to a position where the user inputs the touch to transmit more direct tactile feedback to the user. Therefore, the contact sensitive device 200b is advantageously disposed above the display panel. When the contact sensitive device 200b is disposed above the display panel, excellent light transmittance is required so as not to lower efficiency of the display apparatus and quality of the resulting image.

As illustrated in FIG. 2B, the contact sensitive device 200b includes an electroactive layer 110, a plurality of first electrodes 221, a plurality of second electrodes 222, and a refractive index matching material 250 which fills the nano pores 112 formed on the electroactive layer 110. Light incident on the electroactive layer 110 is reflected at the interface between the nano pores 112 and the PVDF-based polymer 111 due to the difference in the reflective indexes of air, which occupies the nano pores 112, and the PVDF-based polymer 111. As the amount of reflected light increases, the light transmittance of the electroactive layer is lowered and it is difficult to dispose the electroactive layer on the display panel. Therefore, the nano pores 112 are filled with a refractive index matching material.

The refractive index matching material has a refractive index which is similar to that of the PVDF-based polymer 111, thereby reducing the amount of light reflected between the PVDF-based polymer 111 and the nano pores 112.

Generally, the refractive index of the PVDF-based polymer is 1.4 to 1.5. Therefore, the difference of the refractive indexes between the air having a refractive index of 1.0 and the PVDF-based polymer 111 is significantly reduced by injecting the refractive index matching material 250 having a refractive index in a range 1.2 to 1.6, which is similar to the refractive index of the PVDF-based polymer 111. As a result, the light transmittance of the electroactive layer 110 may be improved.

Further, the refractive matching material 250 may serve as an insulator to prevent a short circuit between the plurality of electrodes 221 and 222 disposed on both surfaces of the electroactive layer 110. For example, during the process of forming the plurality of electrodes 221 and 22 on both surfaces of the electroactive layer 110, the electrode material may penetrate the nano pores 112. In such a case, the plurality of first electrodes 221 and the plurality of second electrodes 222 may be connected to each other, thereby causing a short circuit. Such a short circuit may be prevented by filling the nano pores 112 with the refractive index matching material 250.

The refractive index matching material 250 may be an electroactive polymer having high permittivity to improve the permittivity of the electroactive layer 110. When an electric field is applied to the electroactive layer 110 having nano pores 112 filled with an electroactive polymer having a high permittivity, the refractive index matching material 250 may move or vibrate together with the PVDF-based polymer 111. As a result, the contact variable device 200b can produce vibrations having high intensity with a low driving voltage compared with a contact variable device including an electroactive layer having only a PVDF-based polymer.

As described above, the refractive matching material 250 may be an compound having a refractive index similar to that of the PVDF-based polymer 111 and a high dielectric constant to be modified at a low driving voltage. For example, the dielectric constant of the refractive index matching material 250 which is measured at 1 kHz may be 10.0 or higher. When the dielectric constant of the refractive index matching material 250 is 10.0 or higher, the nano pores 112 including the refractive index matching material 250 may generate a sufficiently high intensity of vibration together with the electroactive layer 110 when an electric field is generated between the plurality of electrodes 221 and 222 formed on both surfaces of the electroactive layer 110.

The refractive index matching material 250 may be a PVDF copolymer or a PVDF terpolymer. The PVDF copolymer or the PVDF terpolymer having a refractive index similar to that of the PVDF-based polymer 111 of the electroactive layer 110 and a high dielectric constant is preferred. For example, the PVDF copolymer may be a copolymer including a vinylidenefluoride (VDF) monomer and a PVDF terpolymer. In this case, another monomer which is copolymerized with the VDF monomer may be one or more monomers selected from the group consisting of trifuloroethylene (TrFE), chlorotriflouroethylene (CTFE), tetrafluoroethylene (TFE), chlorofluoroethylene (CFE), hexafluoropropene (HFP), and perfluoromethylvinylether (PMVE), but is not limited thereto. For example, the PVDF copolymer or the PVDF terpolymer may be selected from the group consisting of P(VDF-CTFE), P(VDF-CFE), P(VDF-HFP), P(VDF-CDFE), P(VDF-TrFE-CTFE), P(VDF-TrFE-CFE), P(VDF-TrFE-HFP), P(VDF-TrFE-CDFE), P(VDF-TFE-CTFE), P(VDF-TFE-CFE), P(VDF-TFE-HFP), and P(VDF-TFE-CDFE).

The refractive index matching material 250 is coated on one surface of the electroactive layer 110 to fill the nano pore 112.

Even though not illustrated in FIG. 2, the refractive index matching material 250 not only fills all the plurality of nano pores 112 but also forms an additional coating layer on at least one surface of the electroactive layer 110. That is, the refractive index matching material 250 forms a separate coating layer on the electroactive layer 110 to be used as an auxiliary electroactive layer. Alternatively, coating layers including the refractive index matching material 250 may be formed on both surfaces of the electroactive layer 110 and the plurality of electrodes 221 and 222 may be formed on the coating layers on both surfaces to manufacture the contact sensitive device. In such a case, when a voltage is applied to the plurality of electrodes 221 and 222, the electroactive layer 110 and the coating layers including the refractive index matching material 250 disposed on an upper surface and a lower surface of the electroactive layer 110 are modified or vibrate.

Further, even though all the nano pores 112 are illustrated in FIG. 2B as being filled with the refractive index matching material 250, the present disclosure is not limited thereto, and some nano pores may not be filled.

Figure 3:
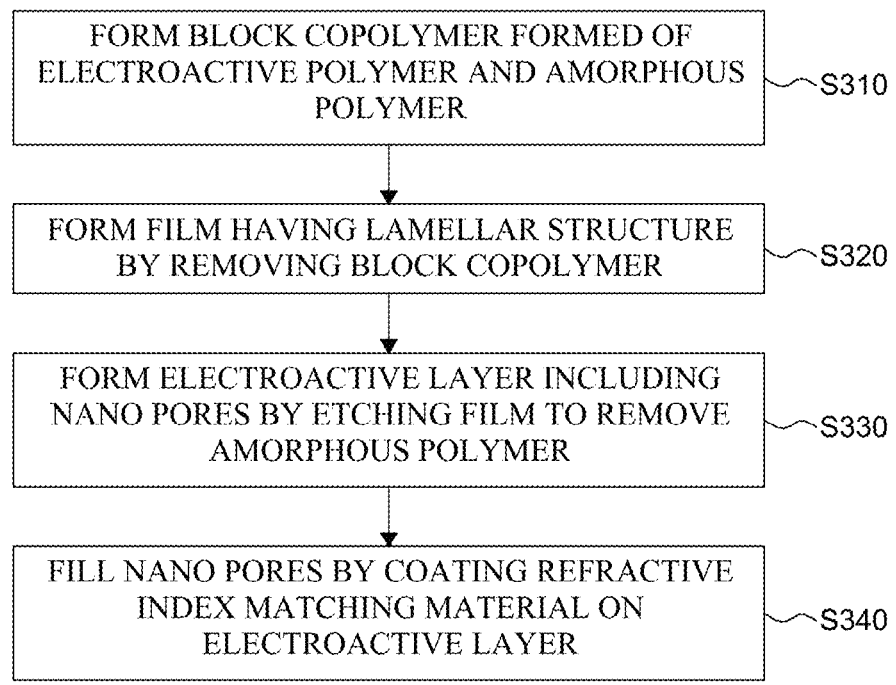
FIG. 3 is a flowchart of a method of manufacturing a variable device according to an exemplary embodiment of the present disclosure.
Figure 4A:
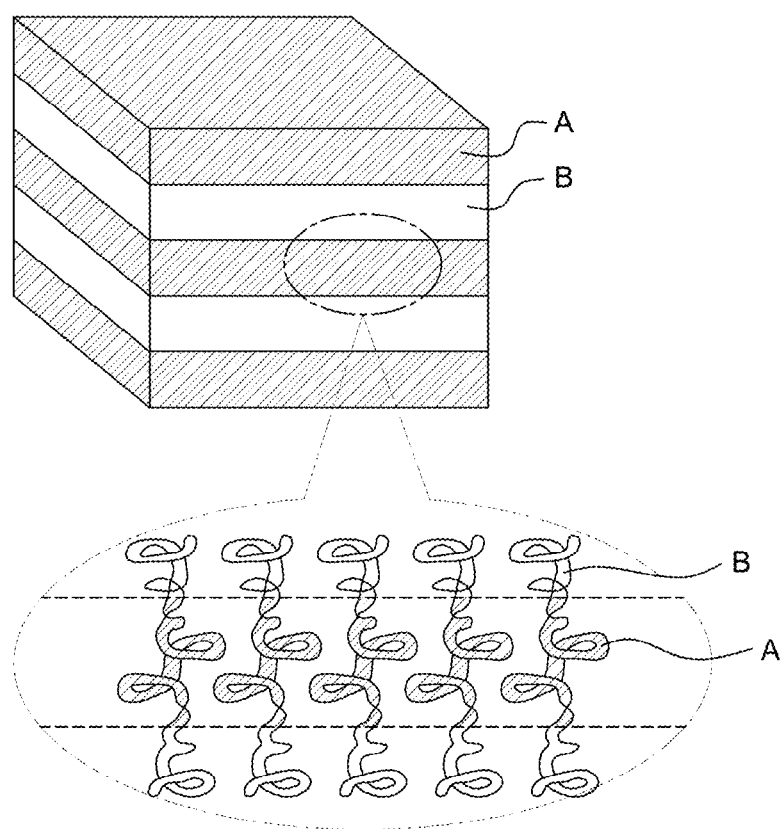
FIGS. 4A to 4C are schematic views illustrating a step of forming a film having a lamellar structure in a method of manufacturing a variable device according to an exemplary embodiment of the present disclosure.
Figure 4B:
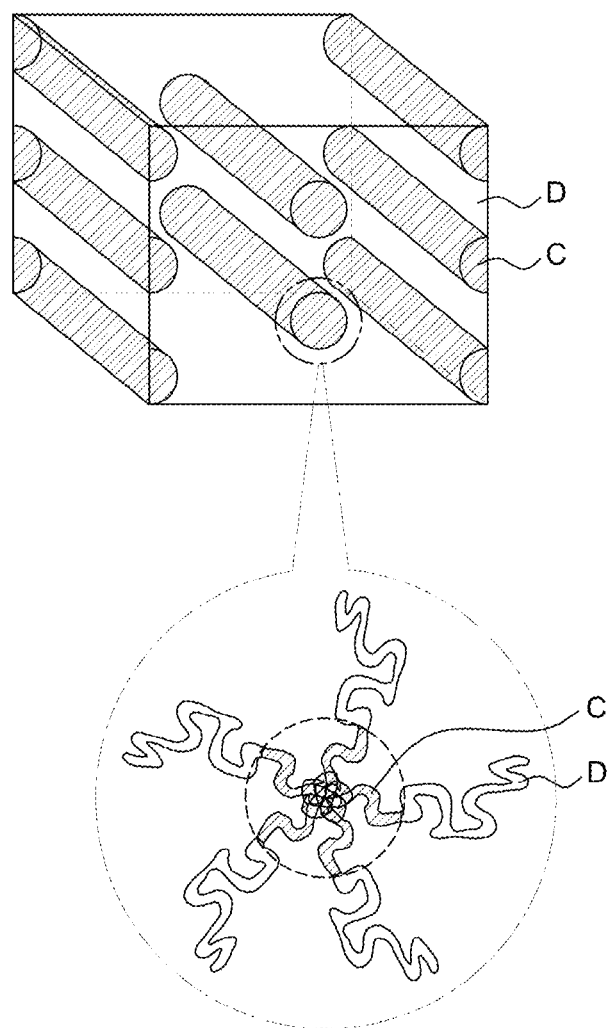
Figure 4C:
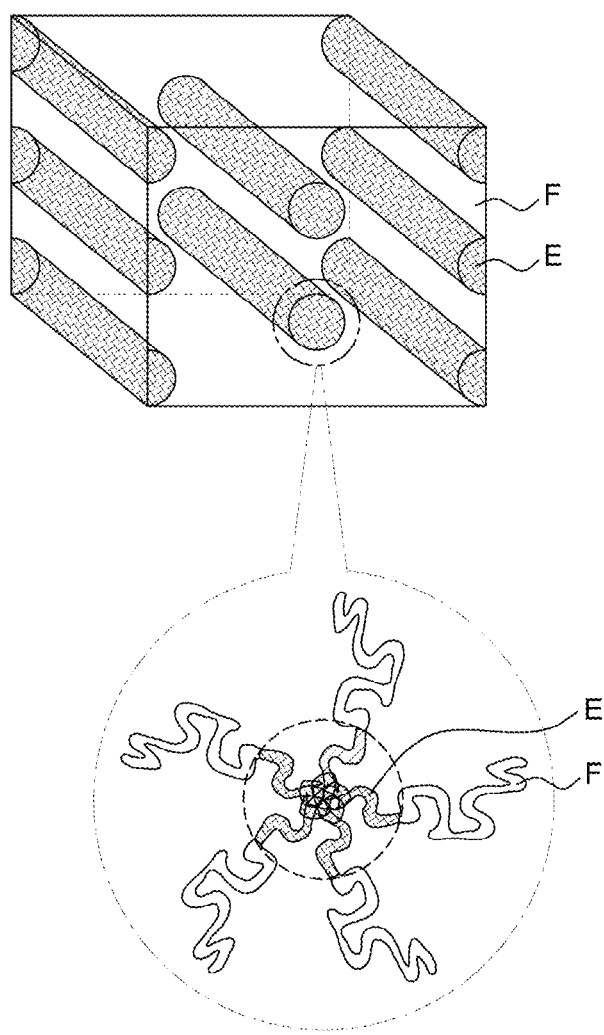

FIG. 3 is a flowchart of a method of manufacturing a variable device according to an exemplary embodiment of the present disclosure, and FIGS. 4A to 4C are schematic views illustrating a step of forming a film having a lamellar structure in a method of manufacturing a variable device according to an exemplary embodiment of the present disclosure. Since the variable device manufactured by the method of manufacturing discussed below is substantially the same as the variable device 100, redundant descriptions thereof are being.

First, a block copolymer of an electroactive polymer and an amorphous polymer is formed in step S310. The step of forming a block copolymer may include forming a chloro group at a terminal of the electroactive polymer and combining with an amorphous polymer In this case, the electroactive polymer may be a crystalline polymer, which advantageously forms a lamellar structure, such as a PVDF-based polymer having excellent piezoelectricity and crystallinity. In the manufacturing method described below, the PVDF-based polymer is used, but the present disclosure is not limited thereto.

The amorphous polymer may be one selected from the group consisting of polystyrene (PS), polybutadiene, polyisobutylene, poly(methyl methacrylate), polycarbonate, polychlorotrifluoroethylene, polyethylene, polypropylene, polytetrafluoroethylene, but is not limited thereto. In this specification, polystyrene is used as an amorphous polymer.

Next, the block copolymer is formed as a film having a lamellar structure in step S320.

A block copolymer powder formed of the PVDF-based polymer and the amorphous polymer is dissolved in an organic solvent, such as dimethyl formamide (DMF) or dimethyl sulfoxide (DMSO), to form a solution containing the block copolymer. Next, the solution containing the block copolymer is coated on a substrate using a spray method, a screen printing method, an inkjet method, a spin coat method, or a solution casting method, and then dried to form a block copolymer film having a lamellar structure.

A recrystallizing process is performed on the block copolymer which is cast and then dried. The PVDF-based polymer forms a nano crystal and the amorphous polymer forms an amorphous layer. Thus, the block copolymer forms a lamellar structure in which the PVDF-based polymers and the amorphous polymers are alternately laminated.

The crystal shape of the lamellar film may be modified according to a content of the PVDF-based polymer and the amorphous polymer, which will be described with reference to FIGS. 4A to 4C.

FIG. 4A is a conceptual view illustrating a block copolymer film having a lamellar structure. As illustrated in FIG. 4A, the block copolymer has a shape in which the PVDF-based polymers A and the amorphous polymers B are copolymerized as alternating layers. In this exemplary embodiment, the PVDF-based polymer and the amorphous polymer are included at a volume fraction of 4:6 to 7:3. When the above-described range of the PVDF-based polymer and the amorphous polymer is satisfied, the block copolymer may have a lamellar structure.

FIGS. 4B and 4C are conceptual views illustrating a block copolymer film having a cylindrical structure. When the volume fraction of the PVDF-based polymer is 0.4 or less, as illustrated in FIG. 4B, a cylindrical block copolymer is formed in which the PVDF-based polymer C is present as a core surrounded by the amorphous polymer D. In such a case, the amount of the PVDF-based polymer is significantly reduced, thereby lowering the polarization intensity and the piezoelectricity of the film.

A cylindrical block copolymer is also formed when the volume fraction of the PVDF-based polymer is 0.7 or higher, but in such a case, the amorphous polymer E is present as the core surrounded by the PVDF-based polymer F. When the amorphous polymer E forms the core of the cylinder, the content of the amorphous polymer E is too small. Therefore, there is no spatial restriction by the amorphous polymer E during the crystal growth of the PVDF-based polymer, and the size of the crystal formed by the PVDF-based polymer is increased such that the PVDF-based polymer does not form a β-phase at the nano-scale, thereby lowering the permittivity of the electroactive layer.

Next, an electroactive layer including a plurality of nano pores is formed by etching the film to remove the amorphous polymer in step S330.

The film having the lamellar structure is etched using an acidic solution, such as a nitrate solution. The amorphous polymer is removed by the etching process to form the nano pores 112 and the PVDF-based polymer 111 remains. In this case, the time and temperature of the etching process may be appropriately set according to the type and size of the desired lamellar film. For example, the temperature of the etching process may be set to be larger than glass transition temperature (Tg) of the amorphous polymer.

Next, the refractive index matching material is coated on the electroactive layer to fill the nano pores in step S340.

The refractive index matching material is used to reduce light reflectance of the electroactive layer, improve light transmittance, and prevent the formation of a short circuit between the electrodes due to the nano pores. A solution of the refractive index matching material is coated on the electroactive layer. The refractive index matching material may fill all pores of the electroactive layer or only fill some of pores. Alternatively, the refractive index matching material may be applied on at least one surface of the electroactive layer to form a separate coating layer. The refractive index matching material may be coated on the electroactive layer using a spray method, a screen printing method, an inkjet method, a spin coating method, or a solution casting method.

If necessary, the step of filling the nano pores by coating the electroactive layer with the refractive index matching material may be omitted.

Next, an electrode may be formed on at least one surface of the electroactive layer.

The electrode may be formed on the electroactive layer by a sputtering method, a printing method, a slit coating method, or the like. The electrode may be formed on both surfaces or only one surface of the electroactive layer. Further, when the electroactive layer is formed by coating a mixture of nano wires and a dielectric elastomer directly on the electrode, the electrode may be formed on the opposite surface by a separate process.

Although a method of manufacturing a variable device 100 has been described with reference to FIGS. 3, 4A to 4C, the contact sensitive devices 200a and 200b may also be manufactured by the above-described method.

Preparative Example 2: Preparation of Chlorine Terminated PVDF

After adding an initiator to the 4-(chloromethyl)-benzoyl peroxide prepared in Preparative Example 1, 145 g of vinylidenefluoride (VDF) monomer was added and then polymerization was performed for 40 minutes at 20 bar and 90° C. Thereafter, the reaction mixture was cooled and chlorine terminated PVDF was obtained.

Preparative Example 3: Preparation of PS-PVDF-PS Block Copolymer

The chlorine terminated PVDF prepared in Preparative Example 2 and styrene were polymerized for five hours at 110° C. at a volume fraction of 6:4. Thereafter, the PS-PVDF-PS block copolymer was crystalized from the reaction mixture and dried.

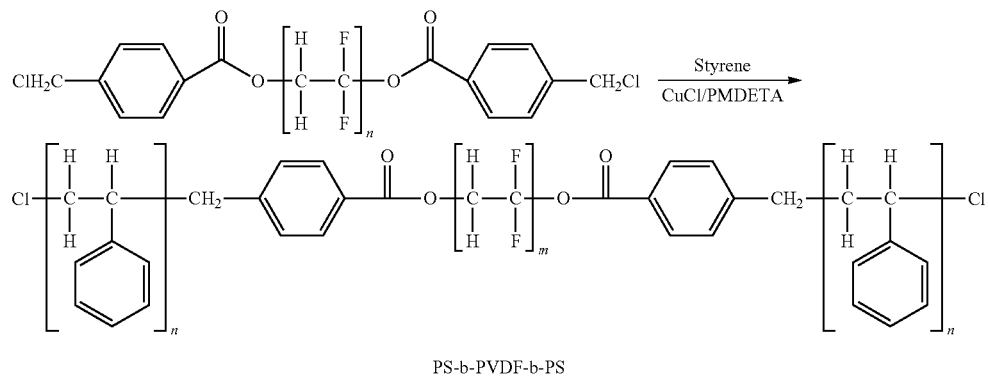

PS-b-PVDF-b-PS

Hereinafter, the present disclosure will be described in with reference to the following Examples, but the scope of the present disclosure is not limited thereto.

Preparative Example 1: Preparation of 4-(chloromethyl)-benzoyl peroxide 4-(Chloromethyl)benzoic acid was dissolved in 0° C. anhydrous DCM and added to a solvent including dimethylformamide (DMF) and a small amount of oxalyl chloride. After reaction for two hours at a room temperature, a yellow residue was obtained, which was immediately dissolved in n-hexane/Et$_2$O solvent. The prepared solution was dropped in lithium peroxide aqueous solution and quickly stirred. After reacting for two hours at room temperature, the prepared solution was diluted in chloroform and washed in water. Thereafter, 4-(chloromethyl)-benzoyl peroxide crystalized through a drying process was obtained.

Example 1

10 weight % of the PS-PVDF-PS block copolymer (PVDF:PS=6:4 in volume fraction) prepared in Preparative Examples 1 to 3 was dissolved in DMF. The prepared solution was spin-coated and then dried for 30 minutes at 120° C. to prepare a PS-PVDF-PS block copolymer film having a lamellar structure. Thereafter, the prepared block copolymer film was dipped in 98% of a nitrate solution for five minutes to remove polystyrene via an etching process, and an electroactive layer having a thickness of 10 μm and a plurality of nano pores was formed. Thereafter, PVDF-TRFF-CFE terpolymer serving as a refractive index matching material was coated on the electroactive layer to form an electroactive layer having a final thickness of 35 μm.

Comparative Example 1

After forming a PVDF homopolymer film in Preparative Example 3, the PVDF homopolymer film was mono-axially stretched. A 100 V/μm polling process was performed on the stretched PVDF film to form an electroactive layer with a thickness of 40 μm.

Comparative Example 2

After solution-casting of PVDF-TRFER-CRE terpolymer in Example 1, PVDF-TRFER-CFE terpolymer was dried to form an electroactive layer with a thickness of 27 μm.

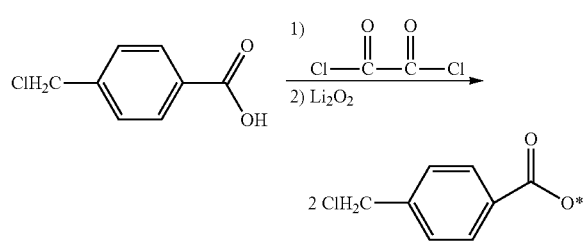

Experimental Example 1: Cross-Sectional Property of Electroactive Layer

A cross-section of the electroactive layer prepared according to Example 1 was imaged using an SEM at a magnification of 50000. The SEM image is shown in FIG. 5.

Figure 5:
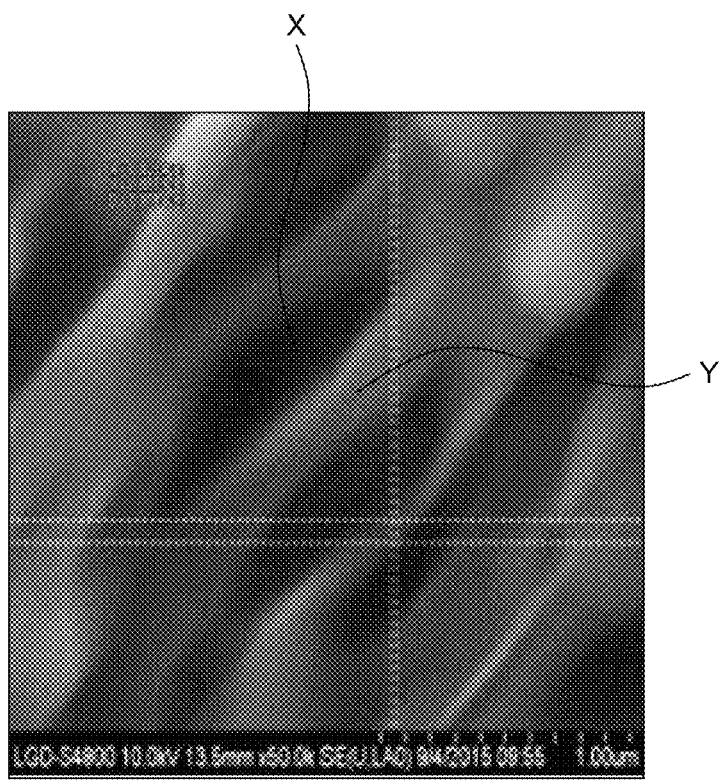
FIG. 5 is a SEM image of a cross-section of an electroactive layer according to Example 1 at a magnification of 50000.

As shown in FIG. 5, nano pores x are formed on the electroactive layer in Example 1 and the nano pores x and the PVDF-based polymer y are arranged in the same direction. That is, a lamellar structure is formed. Further, the pore diameter in a thickness direction of the nano pores x is approximately 50 nm to 100 nm and the distance between nano pores x is approximately 20 nm to 100 nm.

Example 2: Measurement of Vibration Acceleration

An upper electrode and a lower electrode are deposited on both surfaces of the electroactive layer prepared in Example 1, Comparative Example 1, and Comparative Example 2 to manufacture a variable device. Thereafter, a vibration acceleration when voltages of 100 V, 200 V, 300 V, 400 V, and 500 V are applied to the upper electrode at a frequency of 100 kHz and a ground voltage is applied to the lower electrode was measured. The results thereof are shown in FIG. 6.

Figure 6:
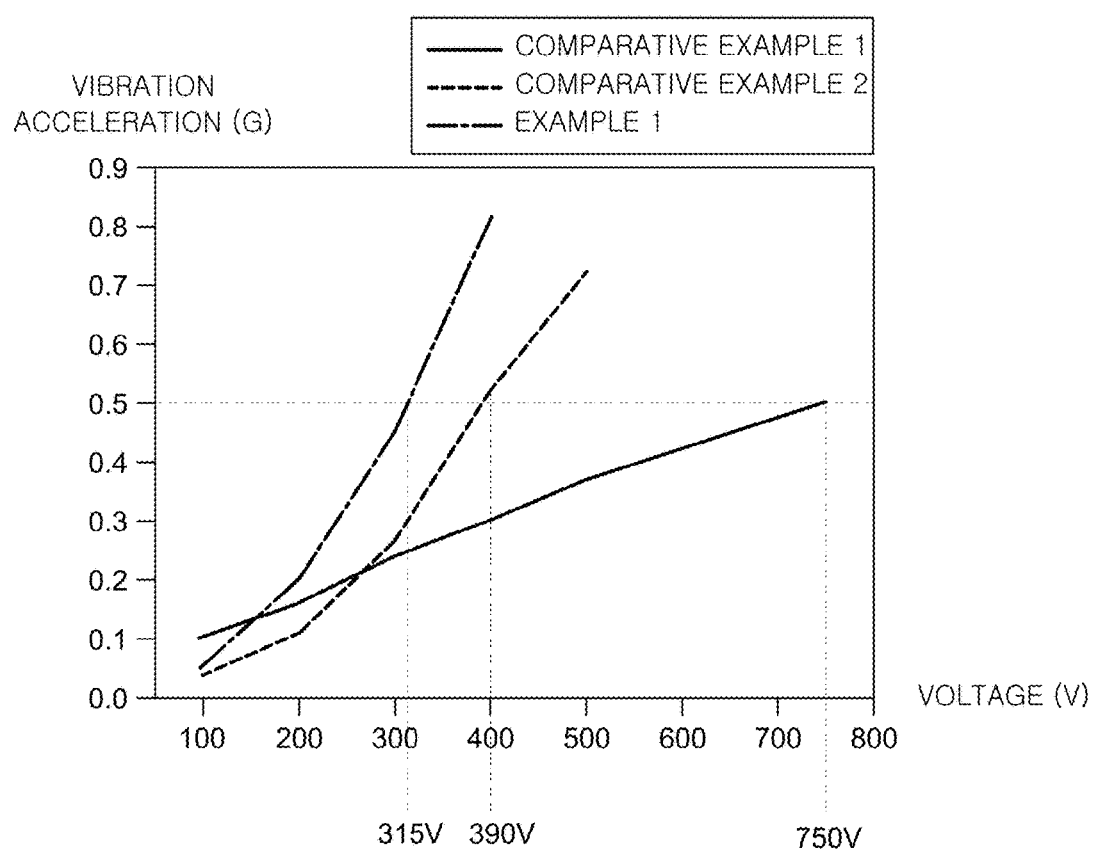
FIG. 6 is a graph of the vibration acceleration as a function of the driving voltage of a variable device according to Example 1, Comparative Example 1, and Comparative Example 2 of the present disclosure.

As shown in FIG. 6, the vibration acceleration of Example 1 is higher than those of Comparative Example 1 and Comparative Example 2 within a voltage range of 100 V to 400 V. That is, a driving displacement and a vibration intensity of the variable device are large at the same voltage. In the meantime, in order to achieve a vibration acceleration of 0.5 G, approximately 750 V of driving voltage needs to be applied in Comparative Example 1 and approximately 390 V of driving voltage needs to be applied in Comparative Example 2. In contrast, only 315 V of driving voltage required for the variable device according to Example 1 to achieve a vibration acceleration of 0.5 G. Thus, the driving voltage of the variable device, and the corresponding power consumption, of the variable device of Example 1 is low.

Figure 7:
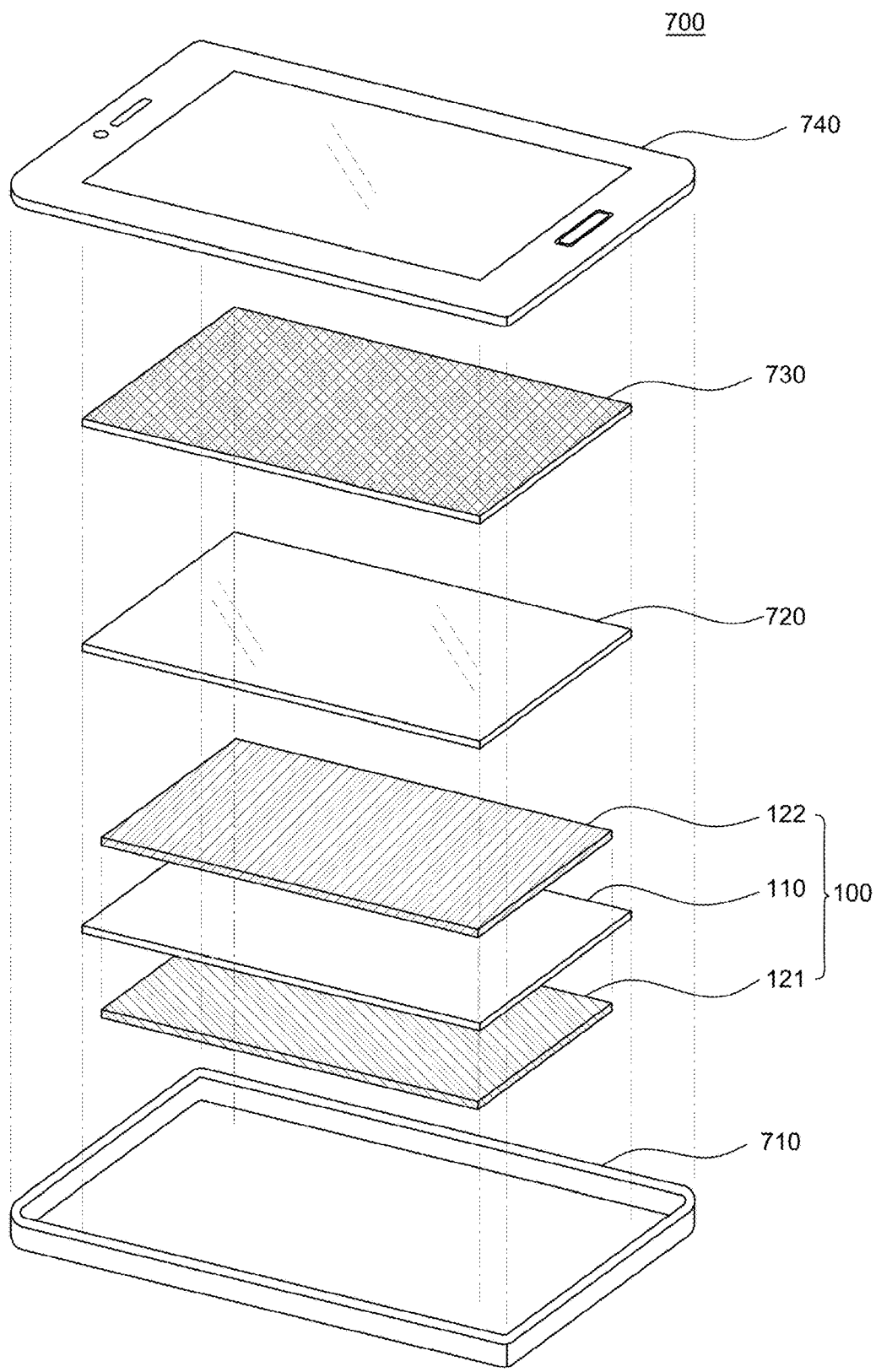
FIG. 7 is a schematic exploded perspective view illustrating a display apparatus including a variable device according to an exemplary embodiment of the present disclosure.

FIG. 7 is a schematic exploded perspective view illustrating the structure of a display apparatus 700 including a variable device according to an exemplary embodiment of the present disclosure. As illustrated in FIG. 7, the display apparatus 700 includes a lower cover 710, a variable device 100, a display panel 720, a touch panel 730, and an upper cover 740.

The lower cover 710 is disposed below the display panel 720 to cover a lower part of the display panel 720, the variable device 100, and the touch panel 730. The lower cover 710 protects internal components of the display apparatus 700 from an external impact or penetration of foreign substances or moisture. For example, the lower cover 710 may be formed of a material such as a plastic which is thermally formed and has good workability, but is not limited thereto. As a flexible display apparatus is actively developed in recent years, the lower cover 710 may be formed of a material which may be deformed according to a shape deformation of the display apparatus 700. For example, the lower cover 710 may be formed of a material such as plastic having ductility.

The variable device 100 is disposed on the lower cover 710 and below the display panel 720. Since specific components of the variable device 100 is substantially same as the variable device 100 illustrated in FIG. 1, redundant descriptions thereof will be omitted. The variable device 100 has an improved driving displacement, that is, improved bending performance and reduced driving voltage, as compared with the variable device using a general PVDF-based polymer. The display panel 720 refers to a panel in which a display device to display an image is disposed in the display apparatus 700. As the display panel 720, various display panels such as an organic light emitting display panel, a liquid crystal display panel, or an electrophoretic display panel may be used. The display panel 720 may be an organic light emitting display apparatus, which allows an organic light emitting layer to emit light by flowing current onto the organic light emitting layer and emits light having a specific wavelength. The organic light emitting display apparatus includes at least a cathode, an organic light emitting layer, and an anode.

The organic light emitting device may be also configured to have ductility and flexibility. That is, the organic light emitting display apparatus is a flexible organic light emitting display apparatus having ductility and including a flexible substrate. The flexible organic light emitting display apparatus may be deformed in various directions and angles by the application of external force.

The touch panel 730 is disposed on the display panel 720. The touch panel 730 is a panel that detects touch input of a user on the display apparatus 700 and provides the touch coordinates.

The touch panel 730 is classified according to a position at which it is disposed. For example, the touch panel 730 may be an add-on type, in which the touch panel is attached on an upper surface of the display panel 720, an on-cell type, in which the touch panel is disposed on the display panel 720, and an in-cell type, in which the touch panel is integrated in the display panel 720. Further, the touch panel 730 may be classified by it's operating method. For example, the touch panel 739 may be a capacitive type, a resistive type, a surface acoustic wave type, an infrared ray type, or the like.

The upper cover 740 is disposed on the touch panel 730 to cover an upper part of the variable device 100, the display panel 720, and the touch panel 730. The upper cover 740 may perform the same function as the lower cover 710. Further, the upper cover 740 may be formed of the same material as the lower cover 710.

Even though not illustrated in FIG. 7, a bonding layer may be used to bond the lower cover 710, the variable device 100, the display panel 720, the touch panel 730, and the upper cover 740. An optical clear adhesive (OCA) or an optical clear resin (OCR) may be used as the bonding layer, but the present disclosure is not limited thereto.

Figure 8:
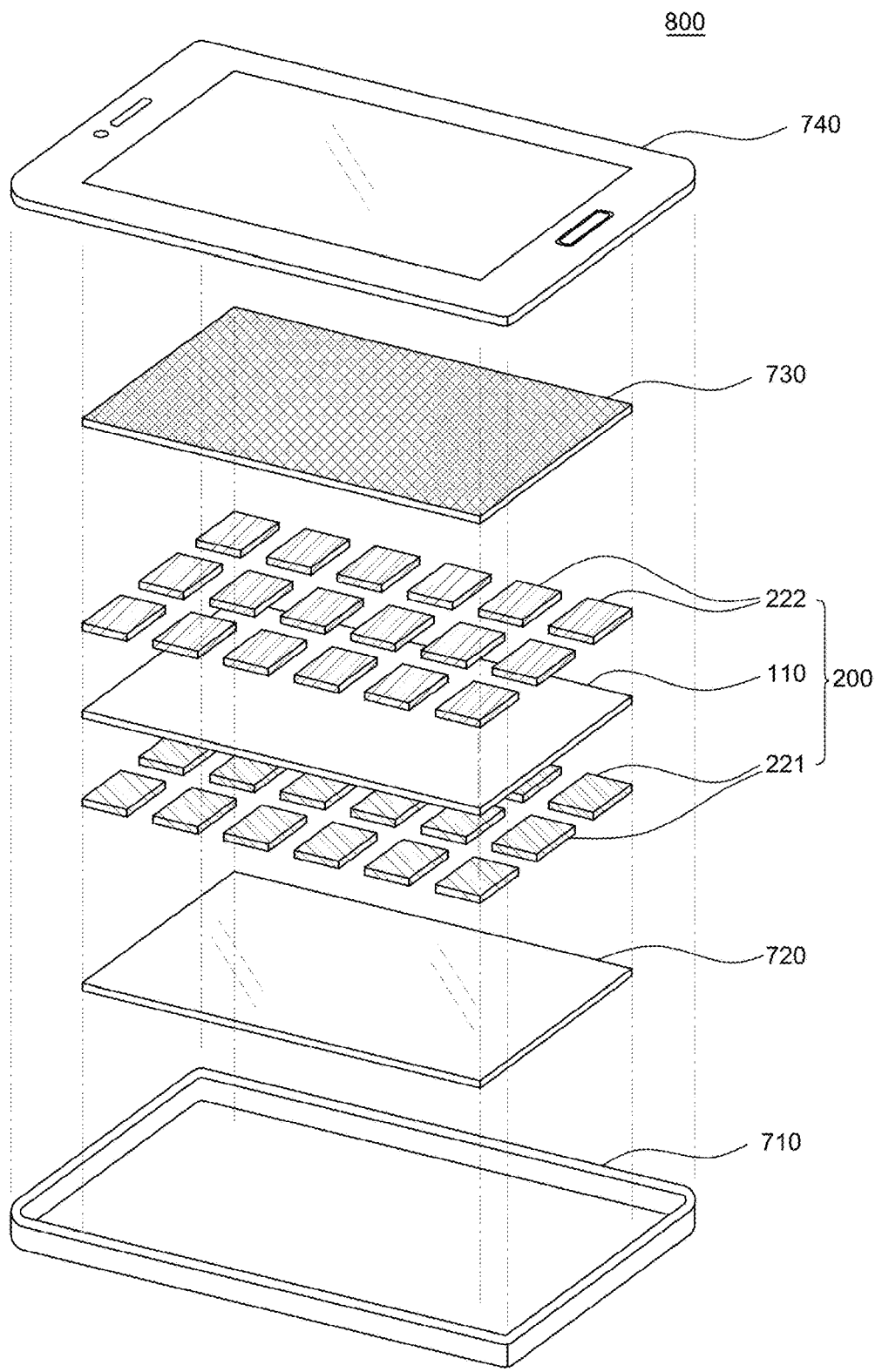
FIG. 8 is a schematic exploded perspective view illustrating a display apparatus including a contact sensitive device according to an exemplary embodiment of the present disclosure.

FIG. 8 is a schematic exploded perspective view illustrating a display apparatus including a contact sensitive device according to an exemplary embodiment of the present disclosure. As illustrated in FIG. 8, the display apparatus 800 includes contact sensitive devices 200a and 200b instead of the variable device 100 and the contact sensitive devices 200a and 200b are disposed on the display panel 720. The other parts are same as the display apparatus 700 illustrated in FIG. 7, and redundant descriptions thereof are omitted.

The contact sensitive devices 200a and 200b are disposed on the display panel 720 and below the touch panel 730. Specific components of the contact sensitive devices 200a and 200b are substantially similar to those of the contact sensitive devices 200a and 200b illustrated in FIGS. 2A and 2B, and redundant descriptions thereof are omitted.

The contact sensitive devices 200a and 200b according to an exemplary embodiment of the present disclosure include an electroactive layer which is formed of an electroactive polymer having a plurality of nano pores so that piezoelectricity is significantly improved and the vibration intensity is also improved as compared with a contact sensitive device using a general electroactive polymer. Further, the nano pores are filled with the refractive index matching material to significantly improve the light transmittance of the contact sensitive device. Therefore, the contact sensitive device may be disposed on the display panel, and may transmit a direct and strong tactile feedback to the user.

Although the exemplary embodiments of the present disclosure have been described in detail with reference to the accompanying drawings, the present disclosure is not limited thereto and may be embodied in many different forms without departing from the technical concept of the present disclosure. The exemplary embodiments of the present disclosure are provided for illustrative purposes only but not intended to limit the technical spirit of the present disclosure. The protective scope of the present disclosure should be construed based on any appended claims and combinations thereof, and all the technical concepts equivalent in scope thereof should be construed as falling within the scope of the present disclosure.

What is claimed is:

1. A contact sensitive device, comprising:
    an electroactive layer comprising an electroactive polymer having a plurality of nano pores surrounded by the electroactive polymer; and
    an electrode disposed on at least one surface of the electroactive layer.

2. The contact sensitive device according to claim 1, wherein the electroactive polymer is a ferroelectric polymer.

3. The contact sensitive device according to claim 2, wherein the electroactive polymer is a polyvinylidenefluoride (PVDF)-based polymer.

4. The contact sensitive device according to claim 1, wherein the plurality of nano pores are arranged in a planar direction with respect to the electroactive layer.

5. The contact sensitive device according to claim 4, wherein the electroactive layer has a lamellar structure in which a PVDF-based polymer and an amorphous polymer are alternately laminated.

6. The contact sensitive device according to claim 1, wherein a pore diameter in the planar direction is larger than a pore diameter in a thickness direction of each of the plurality of nano pores.

7. The contact sensitive device according to claim 1, wherein a porosity of the electroactive layer is 30% to 60%.

8. The contact sensitive device according to claim 1, wherein a density of the electroactive layer is 800 kg/cm$^3$ to 1400 kg/m$^3$.

9. The contact sensitive device according to claim 1, wherein the electroactive polymer is nanocrystalline and has a β-phase structure.

10. The contact sensitive device according to claim 1, further comprising:
    a refractive index matching material, wherein the refractive index matching material is present in the plurality of nano pores.

11. The contact sensitive device according to claim 10, wherein a refractive index of the refractive index matching material is 1.2 to 1.6.

12. The contact sensitive device according to claim 9, wherein the refractive index matching material is one or more selected from the group consisting of polyvinylidenefluoride-trifluoroethylene-chlorotrifluoroethylene (P(VDF-TrFE-CTFE)), polyvinylidenefluoride-trifluoroethylene-chlorofluoroethylene (P(VDF-TrFE-CFE)), polyvinylidenefluoride-trifluoroethylene-hexafluoropropene (P(VDF-TrFE-HFP)), polyvinylidenefluoride-trifluoroethylene-chlorodifluoroethylene (P(VDF-TrFE-CDFE)), polyvinylidenefluoride-tetrafluoroethylene-chlorotrifluoroethylene (P(VDF-TFE-CTFE)), polyvinylidenefluoride-tetrafluoroethylene-chlorofluoroethylene (P(VDF-TFE-CFE)), polyvinylidenefluoride-tetrafluoroethylene-hexafluoropropene (P(VDF-TFE-HFP)), and polyvinylidenefluoride-trifluoroethylene-chlorodifluoroethylene (P(VDF-TFE-CDFE)).

13. The contact sensitive device according to claim 10, further comprising:
    an auxiliary electroactive layer on at least one surface of the electroactive layer, wherein the refractive index matching material is present in the auxiliary electroactive layer.

14. A display apparatus, comprising:
    a display panel; and
    a contact sensitive device,
    wherein the contact sensitive device includes an electroactive layer comprising an electroactive polymer having a plurality of nano pores and an electrode disposed on at least one surface of the electroactive layer, and
    wherein the plurality of nano pores are surrounded by the electroactive polymer.

15. The display apparatus according to claim 14, further comprising:
    a touch panel on the display panel,
    wherein the contact sensitive device is disposed between the display panel and the touch panel.

16. The display apparatus according to claim 15, further comprising:
    a lower cover below the display panel;
    an upper cover on the touch panel; and
    at least one bonding layer used to bond the lower cover, the contact sensitive device, the display panel, the touch panel, and the upper cover.

* * * * *